US010255556B2

(12) United States Patent
Hollenberg et al.

(10) Patent No.: US 10,255,556 B2
(45) Date of Patent: Apr. 9, 2019

(54) APPARATUS AND METHOD FOR QUANTUM PROCESSING

(71) Applicants: NewSouth Innovations Pty Limited, Sydney, NSW (AU); University of Melbourne, Parkville, Victoria (AU)

(72) Inventors: Lloyd Christopher Leonard Hollenberg, Parkville (AU); Charles David Hill, Point Cook (AU); Michelle Yvonne Simmons, Woollahra (AU); Eldad Peretz, Maroubra (AU); Sven Rogge, Stanwell Park (AU); Martin Fuechsle, Maroubra (AU); Samuel James Hile, St Peters (AU)

(73) Assignees: NEWSOUTH INNOVATIONS PTY LIMITED, Sydney, NSW (AU); UNIVERSITY OF MELBOURNE, Parkville, VIC (AU)

( * ) Notice: Subject to any disclaimer, the term of this patent is extended or adjusted under 35 U.S.C. 154(b) by 433 days.

(21) Appl. No.: 14/931,738

(22) Filed: Nov. 3, 2015

(65) Prior Publication Data
US 2016/0125310 A1    May 5, 2016

(30) Foreign Application Priority Data

Nov. 3, 2014   (AU) ............................... 2014904417
Feb. 17, 2015  (AU) ............................... 2015900532

(51) Int. Cl.
*G06N 99/00* (2010.01)
*H01L 27/18* (2006.01)
*H01L 39/02* (2006.01)

(52) U.S. Cl.
CPC .......... *G06N 99/002* (2013.01); *H01L 27/18* (2013.01); *H01L 39/02* (2013.01)

(58) Field of Classification Search
CPC ................................................... G06N 99/002
See application file for complete search history.

(56) References Cited

U.S. PATENT DOCUMENTS

| 6,472,681 B1 * | 10/2002 | Kane .................... B82Y 10/00 |
| | | 257/14 |
| 2011/0060780 A1 | 3/2011 | Berkley et al. |
| 2014/0354326 A1 | 12/2014 | Bonderson et al. |

FOREIGN PATENT DOCUMENTS

WO    WO 03/075220    9/2003

OTHER PUBLICATIONS

Office Action dated Feb. 8, 2018 for U.S. Appl. No. 14/931,768, filed Nov. 3, 2015.

(Continued)

*Primary Examiner* — Amar Movva
(74) *Attorney, Agent, or Firm* — Knobbe Martens Olson & Bear, LLP (57) ABSTRACT

The present disclosure provides a quantum processor realized in a semiconductor material and method to operate the quantum processor to implement adiabatic quantum computation. The quantum processor comprises a plurality of qubit elements disposed in a two-dimensional matrix arrangement. The qubits are implemented using the nuclear or electron spin of phosphorus donor atoms. Further, the processor comprises a control structure with a plurality of control members, each arranged to control a plurality of qubits disposed along a line or a column of the matrix. The control structure is controllable to perform adiabatic quantum error corrected computation.

15 Claims, 11 Drawing Sheets

(56) References Cited

OTHER PUBLICATIONS

Clark, Robert G. et al., Toward a Silicon-Based Nuclear-Spin Quantum Computer, Los Alamos Science, Jan. 1, 2002, pp. 284-301, vol. 27.

Fowler, Austin G. et al., Surface codes: Towards practical large-scale quantum computation, Physical Review A (Atomic, Molecular, and Optical Physics), Oct. 26, 2012, vol. 86: 3.

Hen, Itay, Quantum Adiabatic Circuits, ARXIV.org, Cornell University Library, 201 Olin Library Cornell University, 14853, Jan. 21, 2014, Ithaca, NY.

McKibbin, S.R. et al., Epitaxial top-gated atomic-scale silicon wire in a three-dimensional architecture; Epitaxial top-gated atomic-scale silicon wire in a three-dimensional architecture, Nanotechnology, IOP, Bristol, GB, Jan. 4, 2013, p. 45303, vol. 24: 4.

Morton, John J.L. et al., Solid state quantum memory using the 31P nuclear spin, ARXIV.org, Cornell University Library, 201 Olin Library Cornell University, Mar. 13, 2008, p. 14853, Ithaca, NY.

European Search Report dated Feb. 2, 2017 for European Application No. 15192762.1 filed Nov. 3, 2015.

\* cited by examiner

505 – Transferring the spin state of each electron to its respective nuclear spin 510 – Removing the electrons at the P donor sites through the conductive lines and SET islands For each P donor site 520 – Load an electron at the P donor site 530 – Transfer the spin state from the nucleus of the P donor to the loaded electron 540 – Readout the spin state of the loaded electron

APPARATUS AND METHOD FOR QUANTUM PROCESSING

FIELD OF THE INVENTION

The described technology relates to an advanced processing apparatus and methods to operate the same, particularly, but not exclusively, the described technology relates to a quantum processing apparatus which is controllable to perform adiabatic quantum computation.

BACKGROUND OF THE INVENTION

The power and capacity of computing components such as microprocessors and memory circuits has been increasing for the last 50 years, as the size of the functional units, such as transistors, has been decreasing. This trend is now reaching a limit, however, as it is difficult to make the current functional units (such as MOSFETs) any smaller without affecting their operation.

Developments are ongoing to implement new types of processing apparatus that can implement more powerful computations than current processors, using different approaches. For example, quantum processors are being developed which can perform computations according to the rules of quantum mechanics. Approaches to quantum processors have been developed and described in a number of earlier patents, including U.S. Pat. No. 6,472,681 (Kane), U.S. Pat. No. 6,369,404 (Kane), U.S. Pat. No. 7,732,804 (Hollenberg et al) and U.S. Pat. No. 7,547,648 (Ruess et al.). The disclosure of each of these documents is incorporated herein by reference. Such advanced processing apparatus promise computational paradigms beyond current devices.

One of the challenges to design a performing adiabatic quantum computing architecture is to have a relatively large amount of qubits which can be individually and simultaneously controllable and also coupled to each other.

SUMMARY OF THE INVENTION

In accordance with the first aspect, the described technology provides a quantum processor comprising:
  a plurality of qubit elements, and
  a control structure comprising a plurality of control members, each control member being arranged to control a plurality of qubits;
  wherein the control structure is controllable to perform quantum computation using the qubit elements.

In embodiments, the processing unit further comprises a control element positioned between the first level and second level and the control element and control members are arranged to operate as a single electron transistor (SET).

In embodiments, the control structure is controllable to interact simultaneously with a plurality of qubit elements disposed in patterns of qubits to perform adiabatic quantum computation. For example, the control structure may be controllable to load or unload electrons to or from a plurality of donor atoms simultaneously. The interaction between qubits may be one or a combination of exchange interaction and a dipole-dipole interaction.

In embodiments, a quantum state of the qubit elements is encoded in the nuclear or electron spin of one or more donor atoms disposed in a plane embedded in a semiconducting structure.

In embodiments, a first set of donor atoms is arranged to encode quantum information related to the quantum computation and a second set of donor atoms is arranged to facilitate electromagnetic coupling between one or more of the first set of donor atoms.

In embodiments, the donor atoms of the first set are disposed in a two-dimensional matrix arrangement and the plurality of control members comprises a first set of elongated control members, disposed in a first plane above the plane comprising the donor atoms, and a second set of elongated control members, disposed in a second plane below the plane comprising the donor atoms. Each control member may be disposed between two rows or columns of donor atoms of the first set.

In some embodiments, the control members of the first set are parallel to each other and the control members of the second set are parallel to each other. In addition, the control members of the first set may be disposed transversally to the control members of the second set to form a plurality of intersections where control members of different sets overlap in the direction perpendicular to the plane comprising the donor atoms.

In some embodiments, the control structure further comprises a plurality of control elements disposed on a plane between the first and the second planes between two rows or columns of donor atoms of the first set. Each control element may be operated in synergy with respective control members of the first set and the second set as a single electron transistor. Each control element may be arranged to interact with a plurality of neighbouring donor atoms and the interaction may result in control of the spin orientation of the electron or nucleus of one or more donor atoms.

In embodiments, each donor atom of the first set is arranged to electromagnetically interact with one or more of the other donor atoms of the first set in the matrix via one or more donor atoms of the second set.

In some embodiments, each donor atom of the first set is arranged to electromagnetically interact with at least another donor atom of the first set disposed in a nearest neighbouring position in the matrix of donor atoms of the first set, the interaction being facilitated by one donor atom of the second set.

In some embodiments, one or more donor atoms of the first set are arranged to electromagnetically interact with at least three other donor atoms of the first set, the interaction being facilitated by one or more donor atoms of the second set.

In some embodiments, one or more donor atoms of the first set are arranged to electromagnetically interact with other donor atoms of the first set disposed diagonally to the one or more donor atoms of the first set in the matrix of donor atoms of the first set, the interaction being facilitated by at least a pair of donor atoms of the second set.

In embodiments, the control members are operable to initialise one or more atoms of the second set to prevent electromagnetic interaction between one or more atoms of the first set.

Furthermore, the control members may be operable to perform synchronous readout of the quantum information encoded in a plurality of donor atoms.

In accordance with the second aspect, the described technology provides a processing unit for an advanced processing apparatus, comprising at least one first control member at a first level in a substrate, at least one second control member at a second level in the substrate, the first and second levels being spaced from each other, and a quantum processing element between the first and second control elements.

In accordance with the third aspect, the described technology provides a quantum processing apparatus, comprising a plurality of control lines and a plurality of qubits, each control line being able to affect operation of a plurality of the qubits there being less control lines than the number of a qubits.

In accordance with the fourth aspect, the described technology provides an adiabatic quantum processor, comprising a silicon substrate with single or multiple phosphorus atoms spaced within the substrate in an array of spaced phosphorus atoms, the phosphorus atoms positioned to enable coupling between adjacent qubits for implementation of adiabatic processing.

In accordance with the fifth aspect, the described technology provides a method of operation of an adiabatic quantum processor in accordance with the first aspect, the method comprising the steps of:
  initialising the first set of qubits according to the problem to be solved;
  initialising the second set of qubits according to the problem to be solved;
  rotating the first set of qubits to an equal superposition;
  applying an electromagnetic field to the quantum processor;
  adiabatically turning off the electromagnetic field, and
  measuring the final state of a plurality of the first set of qubits.

A transverse AC field may be used for the electromagnetic field.

In embodiments, the method further comprises the steps of applying control voltages to control members in order to affect one or more donor atoms and via a control element to induce tunnelling of an electron from the control element to the donor a respective donor atom.

In embodiments, the control voltages are applied to the control members in a manner such that a plurality of electrons are loaded on respective donor atoms in a predetermined pattern.

In some embodiments, the method comprises the step of transferring the electron spins of each donor atoms to the nuclear spin of the donor atom.

In some embodiments, the method comprises the steps of transferring the nuclear spin of a plurality of donor atoms to the respective electron spin and reading the electron spin.

In accordance with the sixth aspect, the described technology provides a method of manufacturing an advanced processing apparatus comprising the steps of:
  forming a plurality of processing elements on a surface of the substrate;
  forming a plurality of conductive regions on a surface of a substrate;
  depositing a first layer of a first material on the surface of the substrate, the first material having the same crystallographic structure of the substrate;
  forming a plurality of processing elements on the surface of the first layer;
  forming a plurality of conductive regions about the surface of the first layer, each conductive region being located in proximity of a respective processing element;
  depositing a second layer of the first material on the surface of the first layer;
  forming a plurality of processing elements on a surface of the second layer; and
  forming a plurality of conductive regions on a surface of the second layer.

In embodiments, the steps of forming conductive regions within a crystalline material at the location of the lithographic patterning of the first layer and/or the second layer comprising of doping the regions using the micron to atomic-scale lithographic capability of a scanning tunnelling microscope combined with gaseous doping techniques.

The first and the second layers may be formed by epitaxial growth of the first material by using, for example, molecular beam epitaxy.

In embodiments, the conductive regions formed on the patterned surface of the first layer are conductive islands and each conductive island is arranged to facilitate electrical interaction with the respective processing element.

In embodiments, the processing element is a single atomic element which is patterned with a scanning tunnelling microscope and combined with gaseous doping techniques to incorporate dopant atoms deterministically into the surface.

The donor atoms in the aspects of the described technology above may be phosphorus donor atoms and the semiconductor substrate may be a silicon or germanium substrate. Advantageously, the nuclear spin of ionized phosphorus donors in silicon as it offers near perfect two-state qubit encoding due to the stability of the $^{31}P$ nucleus.

Advantageously, embodiments of the quantum processor provide an architecture which is scalable and allows coupling of multiple qubits at a time, as required for solving NP Hard problems.

In some variations of the processor quantum information may be encoded in a donor site which comprises a plurality of donor atoms arranged in a cluster. The qubit in this case could be encoded using combinations of quantum properties of the donor atoms in the cluster.

BRIEF DESCRIPTION OF THE DRAWINGS

Features and advantages of the described technology will become apparent from the following description of embodiments thereof, by way of example only, with reference to the accompanying drawings, in which.

DETAILED DESCRIPTION OF EMBODIMENTS

Embodiments of the described technology relate to a quantum processor for implementing computations using atomic scale qubits.

A plurality of donor atoms are disposed in a two dimensional matrix arrangement in a silicon lattice. In some variations of the quantum processor qubits may be encoded in donor sites which comprise a plurality of donor atoms arranged in a cluster. The qubit in this case is encoded using combinations of quantum properties of the donor atoms in the cluster.

Data qubit elements are encoded in a first set of the plurality of donor atoms and the remaining donor atoms are arranged to facilitate qubit coupling. The qubits encoded on the second set of donor atoms are also referred herein as 'ancilla' qubits.

Data and ancilla qubits are encoded in the nuclear spin of respective donor atoms. Donor electron and nuclear spins can be rotated simultaneously using a global magnetic field which can be externally applied to the entire architecture. This provides a substantial advantage in respect to architectures which require local (to each qubit) application of the magnetic field.

A control structure is arranged in the silicon to interact with the data qubits and the ancilla qubits. The arrangement of the control structure allows controlling a plurality of qubits simultaneously. In particular the qubits can be controlled simultaneously in patterns distributed across the matrix. The structure can be controlled to load or unload an electron to or from each of the donor atoms and simultaneously on multiple donor atoms.

A number of different structures, materials, architectures and methods of operation may be used to implement quantum computing. An attractive way of fabricating quantum bits, for example, is to use the nuclear spin of ionized phosphorus donors in silicon as it offers near perfect two-state qubit encoding due to the stability of the $^{31}$P nucleus. Quantum control and measurement of ensemble and individual donor nuclear spins verify extremely long quantum coherence times. In addition, donor-based devices can be fabricated using Scanning Tunnelling Microscopy (STM) techniques with near atomic precision.

Adiabatic quantum computers can be used to solve problems encoded in a complex Hamiltonian by using quantum annealing. A system with a simple Hamiltonian is prepared and initialized to the ground state. The simple Hamiltonian is adiabatically evolved to the desired complex Hamiltonian. By the adiabatic theorem, the system remains in the ground state, so at the end the state of the system describes the solution to the problem.

The problem Hamiltonian can be encoded for example on a plurality of quantum bits. Adiabatic architectures based on superconductive qubits have been proposed. A number of QMA-complete problems, for example, can be encoded on an adiabatic quantum processor with a two dimensional grid of qubits.

Figure 1:
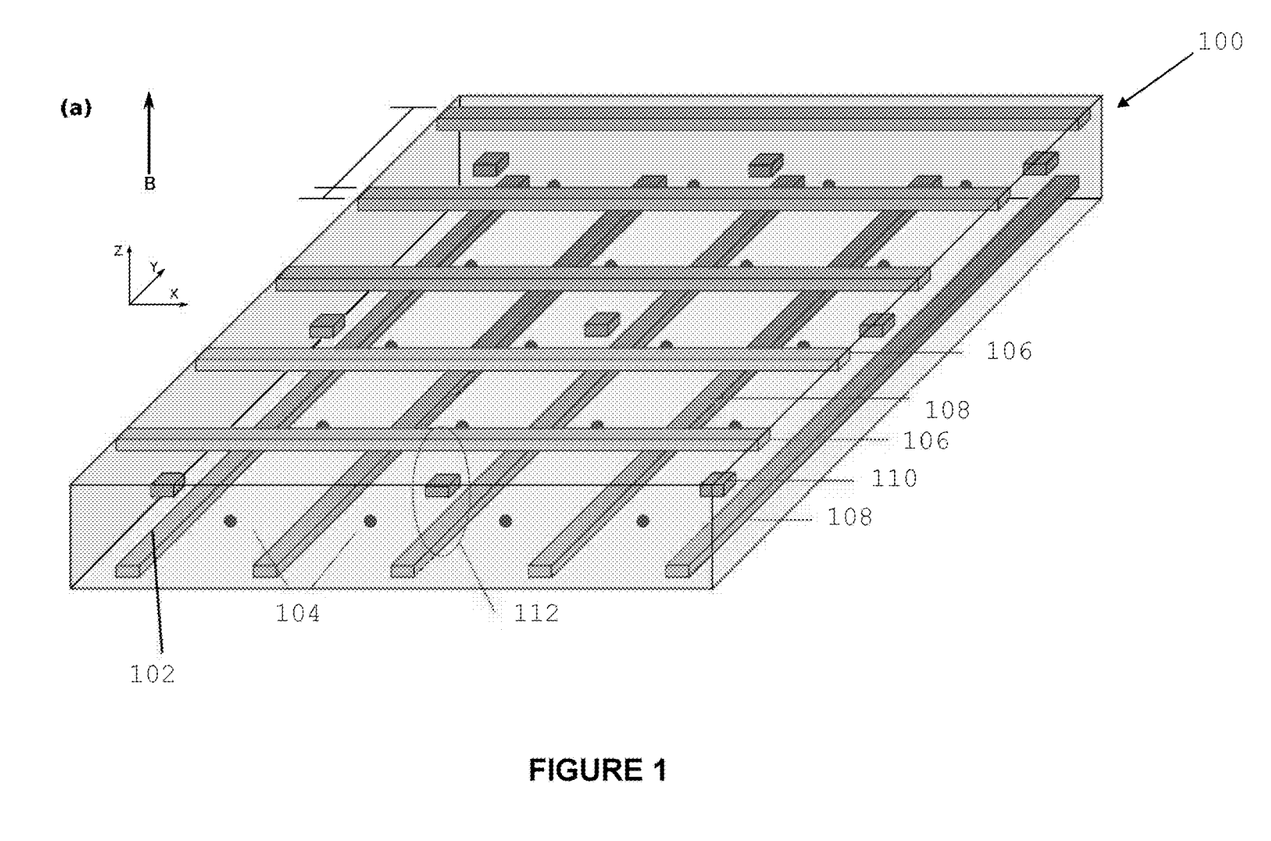
FIGS. 1, 4(a) and 4(b) are schematic representations of an advanced processing apparatus in accordance with embodiments.

Referring now to FIG. 1, there is shown an implementation of a silicon quantum computing architecture 100. The structure is formed in a isotopically purified silicon 28 ($^{28}$Si) substrate 102. A plurality of phosphorus atoms 104 are embedded in the silicon lattice, which in some cases may have strained bonds with at least 2% strain.

Strain mitigates the variation of the strength of the exchange-interaction caused by interference between the six degenerate valley states and allows the reduction of the hyperfine interaction.

Two sets of control members, provided in the form of elongated control lines 108 and 106 extend across the architecture. Control lines 106 are disposed on a plane above the plane comprising the donor atoms and control lines 108 are disposed on a plane below the plane comprising the donor atoms. Control lines 106 and 108 are arranged perpendicularly, with respect to each other, in a criss-cross configuration. In some implementations the control lines may intersect at an angle different from 90°. The control lines 106 and 108 do not physically intersect, however they define intersection points where they pass across two vertically aligned portions of the silicon. About some of these intersections control elements, provided in the form of a heavily doped silicon island 110, are formed. Each island forms a single electron transistor (SET) 112 with respective control members disposed above and below the island. A pair of these control members acts as source and drain of the transistor, which is additionally controlled by the four surrounding control members.

A possible technique to manufacture architecture 100 is to start from a pure silicon wafer and fabricate the structures on each plane exploiting the lithographic capabilities of a scanning tunnelling microscope together with silicon epitaxy. In operation, the entire device is cooled to the mK regime, operates in a magnetic field of approximately B=2T with an externally applied (global) RF and MW control.

Control lines on the top and bottom planes are separated in two interleaved groups 209 and 208. Control lines 209 act as drains of the SETs and control lines 208 act as gates of the SETs 112. A similar configuration is shown for the control lines on the top plane 207 and 206, which act respectively as sources and gates of the SETs. Each SET 112 interacts with one or more donor atoms 104 through the respective control island 110. In the embodiment described, each island 110 is configured to interact with four donor atoms 104 to form a unitary cell of the architecture. SETs 112 can be controlled, by applying electrical signals to control lines 206 to 209, to load or unload electrons on each donor atom 104 in the architecture or control the spin orientation of an electron or nucleus of one or more donor atoms. Furthermore, the configuration of the donor atoms 104 and the control lines allows for loading or unloading of electrons on multiple donor atoms arranged in predetermined patterns simultaneously. For example, electrons could be loaded onto a plurality donor atoms disposed on a quadrangular pattern.

Figure 2:
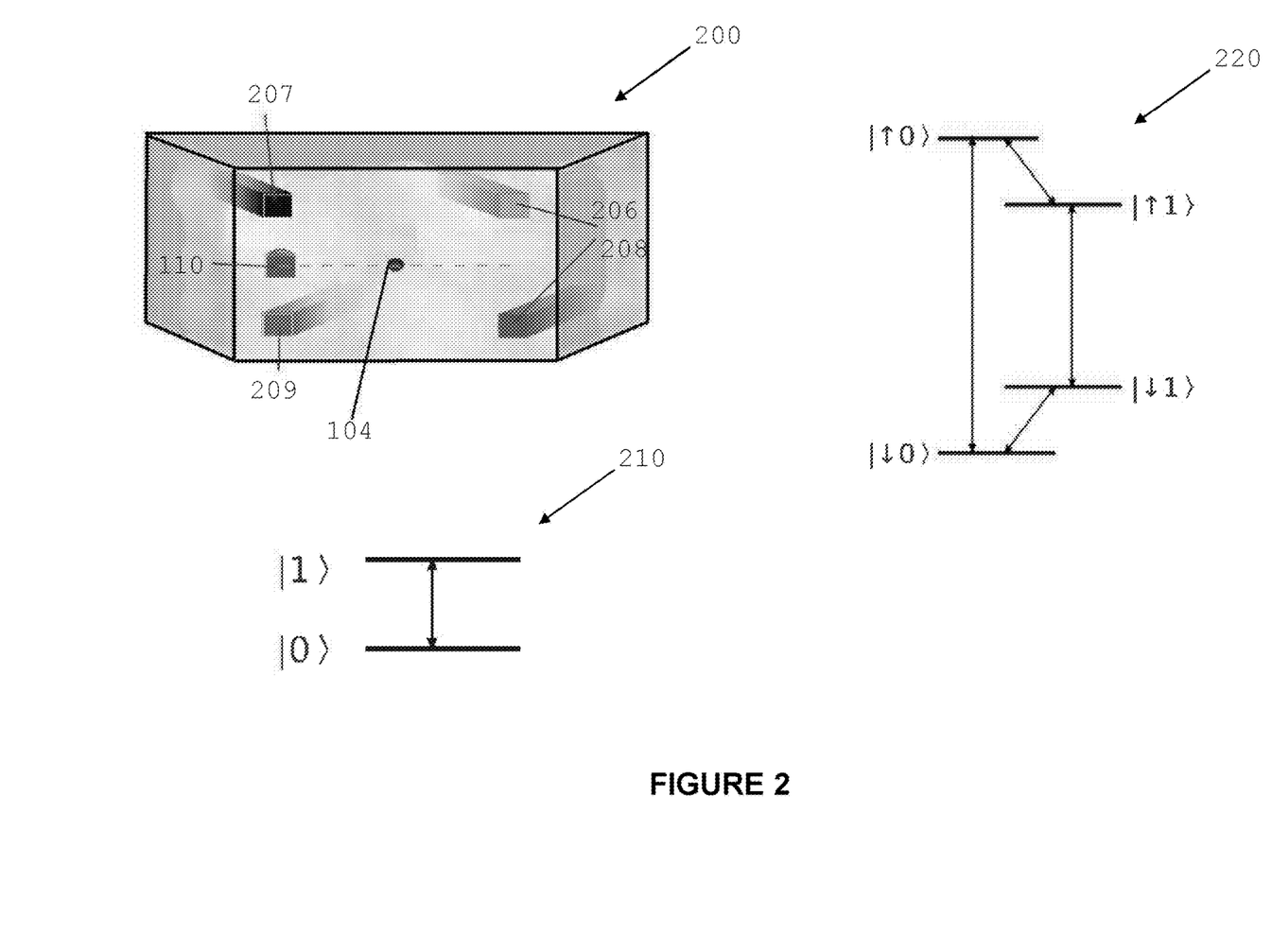
FIG. 2 is a schematic representation of a processing element, in the form of a single qubit unit.

Referring now to FIG. 2, there is shown a further view 200 of a donor atom in a qubit memory state with respective control lines and control island. In this 'memory' state the hyperfine interaction is naturally exactly zero, since no electron is present. Energy diagram 320 shows the energy levels relevant to ESR/NMR control. The four energy levels have four allowed transitions, two RF NMR transitions, and two microwave ESR transitions. Each of these transitions can be individually targeted to perform single qubit rotations and electron-nuclear spin interactions.

By selectively loading electrons on specific donor atoms, quantum gate operations can be selectively and simultaneously performed across the quantum computing architecture.

Loading an electron onto a given donor location, by pulsing the corresponding gates, endows that a donor with a non-zero hyperfine interaction between the nuclear and electron spin immediately after the electron is loaded. This shifts the resonant frequency of the given donor nuclear spin. A given set of qubits can thus be brought independently into resonance with global RF/MW fields to affect a desired single qubit gate. This is a highly uniform digital change in the hyperfine value, and is governed by the donor-island tunnelling process, which can be engineered with atomic precision, and characterized in the system set-up phase.

In the memory state the qubit nuclear spin is far off resonance and not affected by the global control fields.

Two qubit interactions between nearest neighbour nuclear spin qubits are also controlled by electron load/unload operations. In the absence of bound electrons the interaction between nuclear spins at these separations is negligible. However, when electrons are loaded on adjacent atoms, in addition to any exchange coupling felt by the electrons, the spin-spin dipole interaction increases by a factor of $(g\mu_B/g_n\mu_n)^2 \approx 3 \times 10^6$ effectively switching the inter-qubit interaction on digitally.

In an ionized state the nuclear spins of well-spaced donors in an isotopically pure silicon material have negligible interaction with either electron spins or with nearby donor nuclear spins. As a consequence there is no leakage of qubit information to higher orbital states, and since the donor atom is fixed in space the overall qubit loss is zero. The T2 time of the nuclear spin is extremely long and has been measured to be 39 minutes. In the qubit memory (idle) state the donors are ionized. In this situation, the nuclear spins precess according to the Zeeman Hamiltonian.

$$H^n_{idle} = -g_n\mu_n B_z Z_n$$

Here $g_n$ is the nuclear g-factor, $\mu_n$ is the nuclear dipole moment, $B_z$ is the applied magnetic field (along the z-axis), and $Z_n$ is the Pauli Z-operator applying to the nuclear spin. In general hereafter the operators X, Y and Z refer to the corresponding Pauli matrices. Sub-scripts e and n refer to electronic and nuclear spins. The energy splitting of the qubit states, of an ionized donor 104 is uniformly $\Delta E_{idle} = 2g_n\mu_n B_z$.

Figure 3:
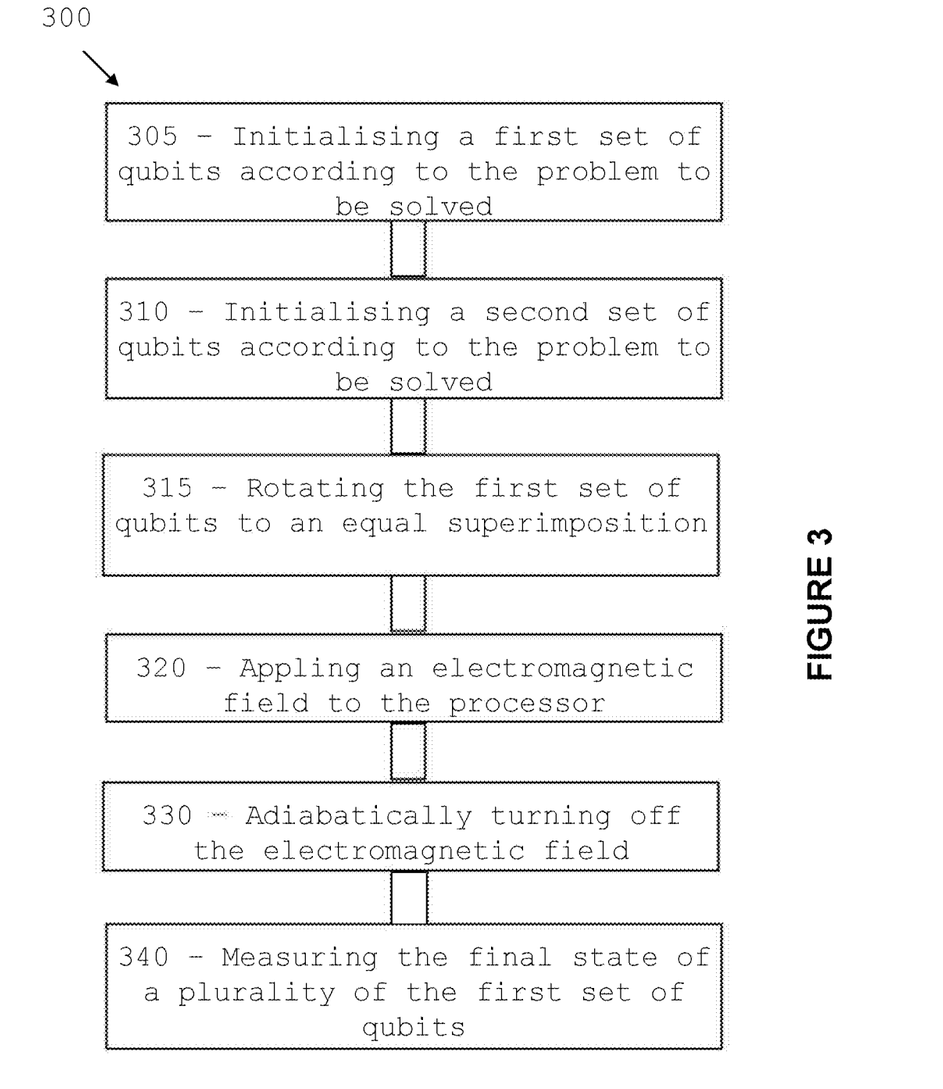
FIGS. 3 and 5 are flow diagrams outlining operational steps for an advanced processing apparatus in accordance with embodiments.

Referring now to FIG. 3, there is shown a flow diagram 300 outlining steps required to solve a problem using adiabatic quantum computing with an architecture in accordance with embodiments. Steps 305 and 310 allow encoding the problem to be solved on the matrix of qubit by initialising a first and second set of qubits. For example, electrons with appropriate spins can be loaded at specific qubit sites. The first set of qubits is rotated to be in equal superposition at step 315. The rotation of the electron spins may be realised by applying an electromagnetic field around the qubits' Bloch sphere y-axis. The electromagnetic field may be in the form of a plurality of microwave electron spin resonance pulses with different frequencies. Alternatively, the electromagnetic field may be applied in a direction transverse to the matrix of qubits out of resonance with the electron spins. The field may be adiabatically tuned to be in resonance with the electron spins by taking the electron spins in equal superposition. Subsequently, a perturbation, such as a transverse AC field, is applied to the system, step 320. The perturbation is then adiabatically removed ensuring that the system remains in the ground state of an Hamiltonian that represents the solution to the problem of interest, step 330. The status of the first set of qubits at the end of the adiabatic process encodes a solution to the problem of interest. This solution can be obtained by measuring the final state of a plurality of the first set of qubits, step 340.

The adiabatic computation time must fulfil the condition:

$$T \gg 1/\Delta^2$$

$\Delta$ is proportional to the minimum energy gap between the ground and the first excited states of the problem Hamiltonian which is being solved. $\Delta$ is also proportional to the coupling between different qubits of the matrix and decreases when the problem grows in size.

For the system to evolve in a coherent manner the adiabatic computation time must be much shorter than the system's dephasing time. The architectures realised in accordance with embodiments have a characteristic dephasing time which is generally longer than the typical computation time. This means that the quantum computation is performed fully coherently. This may not be the case for adiabatic quantum computation implemented in alternative architectures, such as superconducting architectures.

Figure 4A:
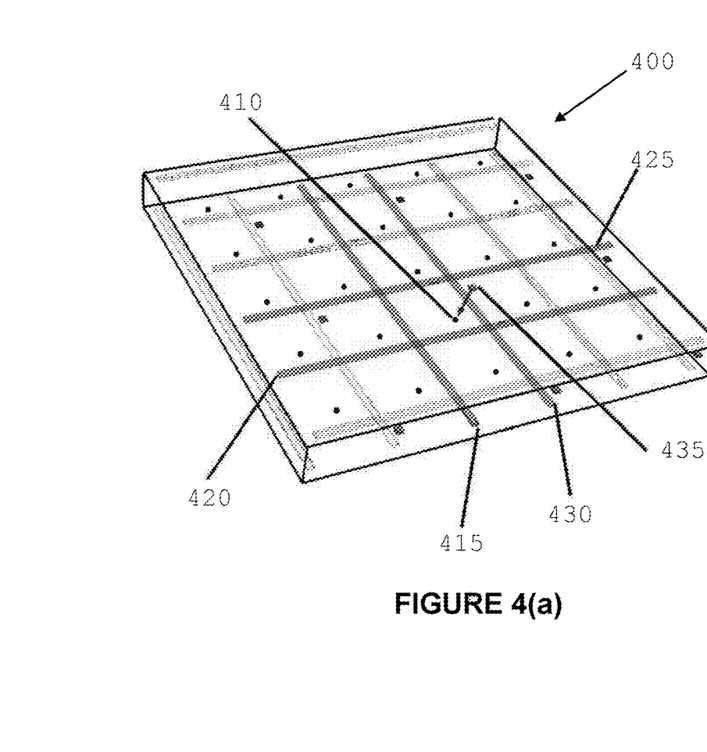
Figure 4B:
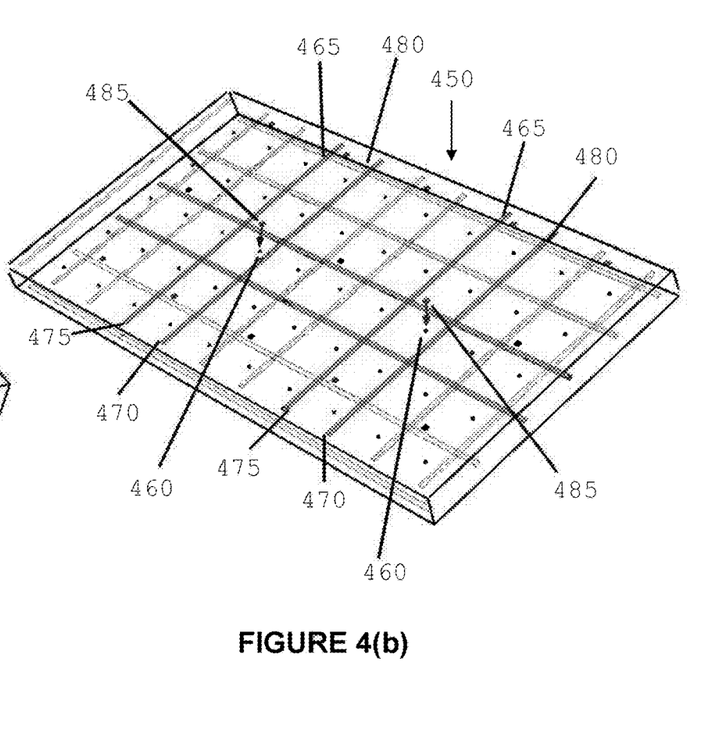

Referring now to FIGS. 4(*a*) and 4(*b*), there are shown two schematic representations 400, 450 of an architecture in accordance with embodiments. In FIG. 4(*a*) the conductive lines used to load or readout the state of an electron at a single P atom site 410 are shown. To load an electron at the P donor 410 site the two gate lines 425, 430, the source line 420 and the drain line 415 are biased in a manner to induce an electron to tunnel from a SET island 435 to the corresponding P donor site 410. The combination of voltages applied to these control lines is such that an electron can only tunnel through one SET island 435 and no electrons can tunnel through any other SET islands of the matrix of qubits. Such configuration of the control lines allows for loading or reading of the state of a single electron on the matrix of qubits.

The matrix architecture provides the possibility of loading or reading the state of multiple electrons at multiple qubit sites simultaneously, as shown in FIG. 4(*b*). In FIG. 4(*b*) multiple conductive lines are controlled to load or readout the state of electrons at a plurality of single P atom sites 460. To load electrons at a plurality of P donor sites 460 the gate lines 475 and the source lines 470 are activated and biased with appropriate voltages. Electrons can be loaded at any of the donor sites 460 associated with gate lines 475 and source lines 470 by controlling the voltages of the drain lines and gate lines at the upper level of the architecture. The drain lines 465 and gate lines 480 are controlled to simultaneously load two electrons on corresponding two P donor sites 460 through the respective SET islands 485. The simultaneous control of the different control lines across the matrix allows accessing a plurality of P donor sites at the same time to load electrons or to read the quantum state of the P donor sites. This simultaneous, global, control enables rapid operation of the quantum processor. The architecture of the apparatus allows simultaneous access to P donor sites arranged in basic patterns, such as lines, rectangles and regular repeating patterns. More complex patterns of sites on the matrix can be realised by iterating combinations of the basic patterns. Loading can proceed in several N(load) steps. Each loading step requires a loading time of T(load). In order to preserve the state of the system, for example during the loading phase of the P donor sites 660, the total loading time should be much shorter than the electrons decoherence time:

$$N(\text{load})T(\text{load}) \ll T1(\text{electron})$$

This requirement is generally met, given the long decoherence times of architectures realised according to embodiments, using the Si:P system. The dephasing of the electron and nuclear spins is not relevant during the loading phase since all nuclei and electronic spins are initialized either spin down or spin up and not yet in superposition.

Once electrons have been loaded at the P donor sites 460, and nuclear spins polarized, the electron spins are rotated 430 to be in equal superposition, as discussed above.

After the ramping down of the electromagnetic field 330, the solution to the problem of interest is encoded in the nuclear or electron spins. Measuring the state of each electron spin 340 may require time. If this time exceeds the typical time during which the electrons are capable of retaining their spin, the accuracy of the solution may be affected.

Figure 5:
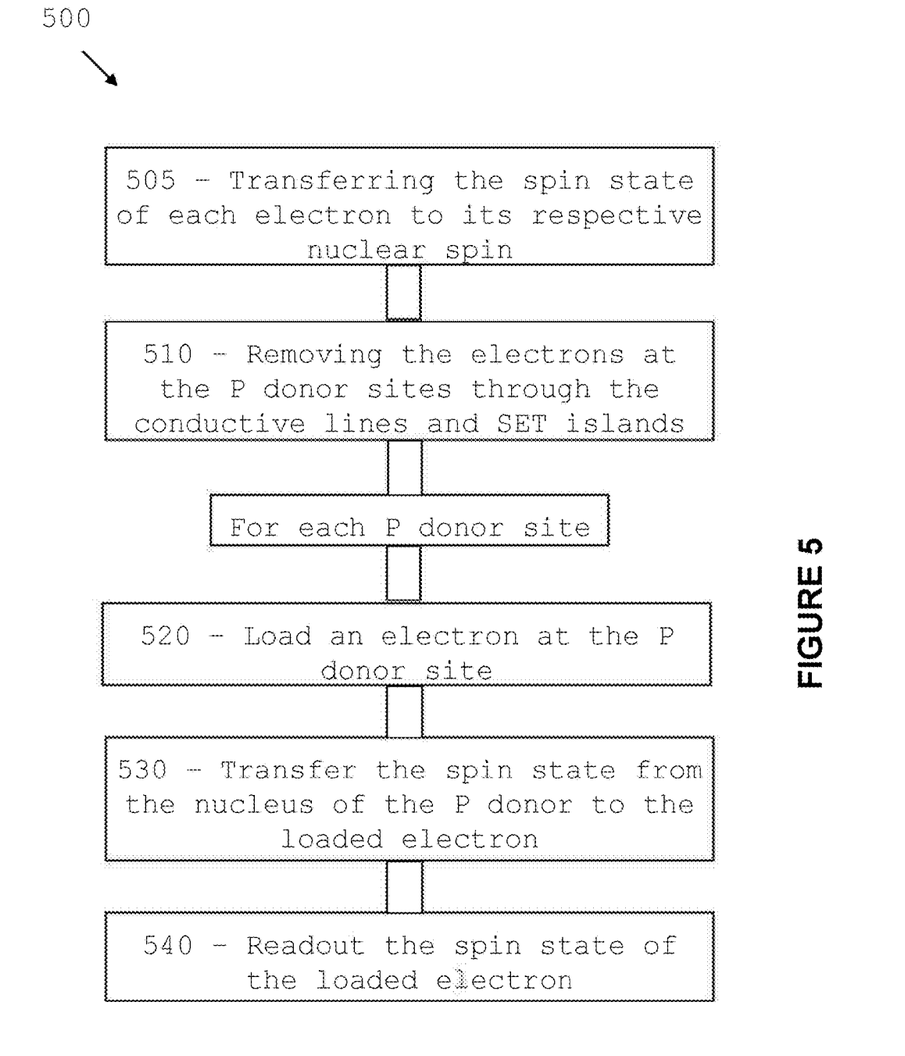

Referring now to FIG. 5, there is shown a flow diagram 500 outlining additional steps used to implement a delayed readout process in accordance with an embodiment. In this embodiment a long lived memory function is used during the electrons readout process. The memory function is implemented by using the nuclear spin of the phosphorus P donor atoms. The steps shown in diagram 500 of FIG. 5 are executed after the adiabatic process is completed. If the solution is encoded in the electron spins the state of the electron spin is transferred 505 to the respective nuclear spin state by applying an electromagnetic pulse at a predefined frequency. If the solution is encoded in the state of the nuclear spins step 505 is omitted. The electrons can then be removed 510 from the P donor sites through appropriate biasing of the control lines. At this stage the solution to the problem of interest is encoded in the nuclear spins of the matrix of qubits. Each spin can be read by loading 520 an electron at a P donor site, transferring 530 the spin state from the nucleus of the P donor to the loaded electron and reading 540 the state of the loaded electron by using the respective conductive lines and SET islands. This procedure is applied to every qubit of the matrix until a full readout is obtained. The readout procedure described above and illustrated in FIG. 5 is a non-destructive procedure and can be repeated many times until the desired readout fidelity is reached.

The accuracy of this readout procedure is very high as the solution to the problem of interest is encoded in the nuclear spin states. Only spin flips of the nuclear spins may cause errors. However, the nuclear spin relaxation time in these architectures is much longer than the time required to read the entire matrix of qubits, and thus the probability of error is low. If the measurement is performed a single qubit at a time, and there are n spins to read out, each of which is read m times to ensure a high fidelity, the total measurement time would be $nmT_m$. $T_m$ is the time required by each measurement. To preserve measurement accuracy the total measurement time must be much shorter than the system's nuclear spin relaxation time.

$$nmT_m << T_1^{(n)}$$

The nuclear spin relaxation time is generally much longer than the measurement time and allows for high fidelity reading of thousands of qubits.

To initially encode the problem Hamiltonian in the matrix of qubits it is necessary to be able to setup different couplings between neighbouring qubits.

The spins of the free electron of the P donor atoms 110 of the architecture 100 of FIG. 1 may interact through exchange interaction or via dipole-dipole interaction. The magnitude of each type of interaction varies depending on the physical distance between the P donor atoms 110.

Figure 6:
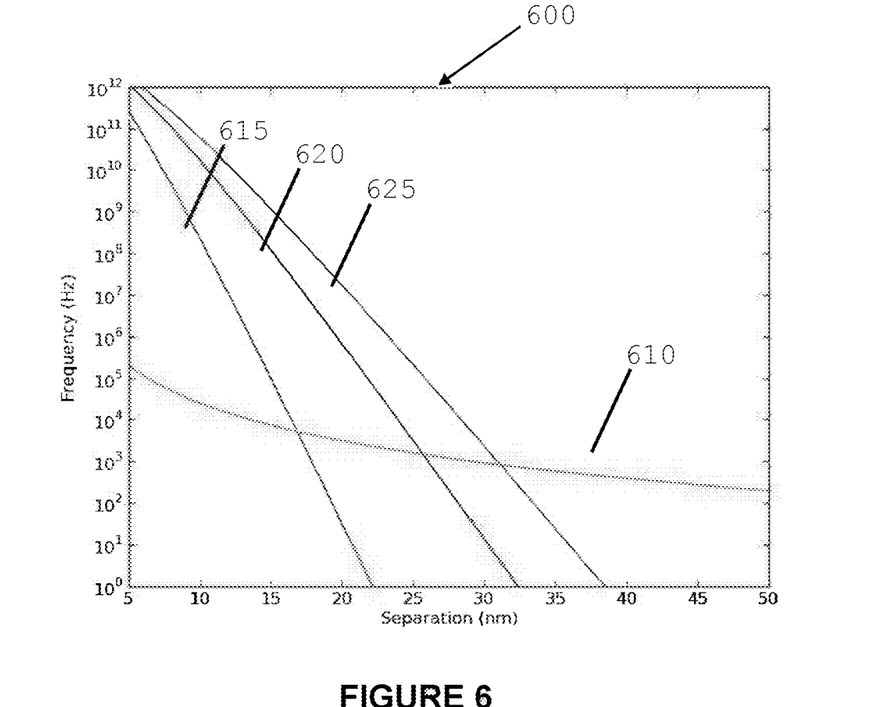
FIG. 6 is a diagram showing the strength of the interaction between electron spins.

FIG. 6 shows a diagram 600 representing the coupling strengths of electron spins a as a function of the physical separation of the P donor atoms 110. The dipole interaction 610 only varies a few orders of magnitude across the whole range of separations in diagram 600. The dipole interaction 610 may prevail on the exchange interaction 615, 620, 625 for separations above 20 nm depending on the crystal orientation. For separations above 35 nm the dipole interaction 610 is larger than the exchange interaction in all three crystal directions. The exchange interaction is proportional to the overlap between electronic spin wave functions of the P donor atoms 110 and decays very quickly with the distance between these atoms. This interaction is sensitive to the crystal orientation, due to the different electronic potentials, and varies in strength in one lattice site. The exchange interaction may be used in some embodiments where strong coupling of neighbour qubits is required and coupling of higher order neighbours is not crucial, such as in adiabatic quantum computing. The dipole interaction, although weaker in magnitude, is less variable and can reach higher order neighbour qubits. This interaction may be used in embodiments implementing a gate quantum computer or an adiabatic quantum computer.

Alternative coupling methods may be realised depending on how the quantum information is encoded in the processing elements. For example, using a combination of the electronic and nuclear spins, or using only the electronic spins. Further, different coupling methods may be used if the information is defined by the electron spin direction and the absence of an electron at the processing element, the presence of spin triplets or singlets at the processing element, multiple donors to represent a qubit or placement and orientation of the electronic spins.

Figure 7A:
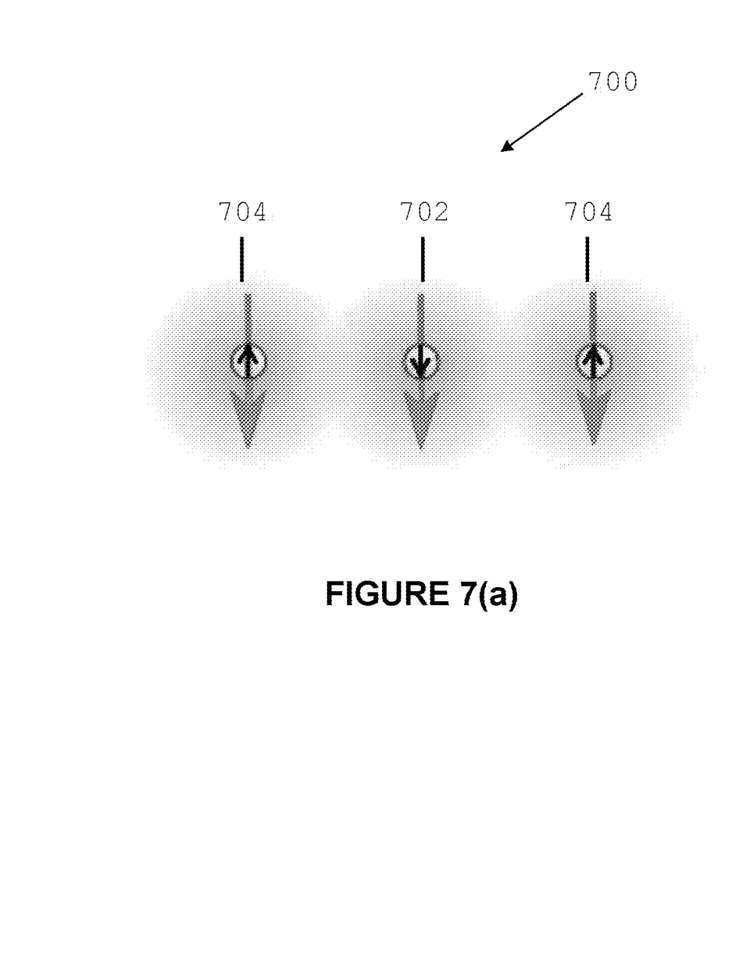
FIGS. 7(a), 7(b), 8(a), 8(b) and 8(c) are illustrations of coupling methods in accordance with embodiments.
Figure 7B:
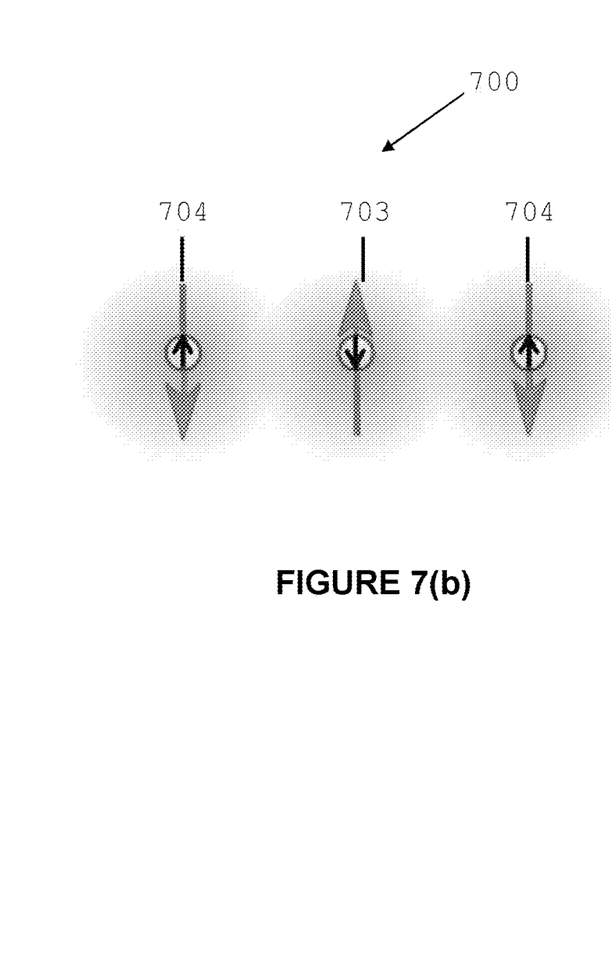

For example, when coupling is based on the dipole-dipole interaction, the coupling strength between two qubits on the matrix separated by a distance d is $D/d^3$ and has a positive sign. In order to realise couplings between qubits with a negative sign, additional 'coupling qubits' (or 'ancilla qubits') may be added between the 'data qubits'. The coupling qubits effectively increase the number of qubits on the qubit matrix. Referring now to FIG. 7(a), there is shown an illustration of a two data qubits system 700, with one ancilla qubit 702, positioned between the data qubits 704. The sign of the coupling is determined by the downwards spin orientation of the ancilla qubit 702. FIG. 7(b) shows the same qubit system 700 where the two data qubits 704 are coupled with an opposite sign to the system 700 of FIG. 7(a) due to the upwards spin of the ancilla qubit 703.

When this coupling method is used for performing adiabatic quantum computing the ancilla qubits are loaded at the beginning of the adiabatic protocol, and largely remain in the same state throughout the operation of the adiabatic protocol. The coupling between nuclear spins may instead be achieved via the use of coherent electromagnetic pulses, for example ESR pulses. To implement zero coupling, using this coupling method, no electron is loaded onto the ancilla qubit between the two data qubits. In this case, the data qubits are separated by double the distance, resulting in a dipole coupling which is 8 times weaker than between data qubits and ancilla qubits, and interactions with nuclear spins and an exchange coupling orders of magnitude weaker.

Figure 8A:
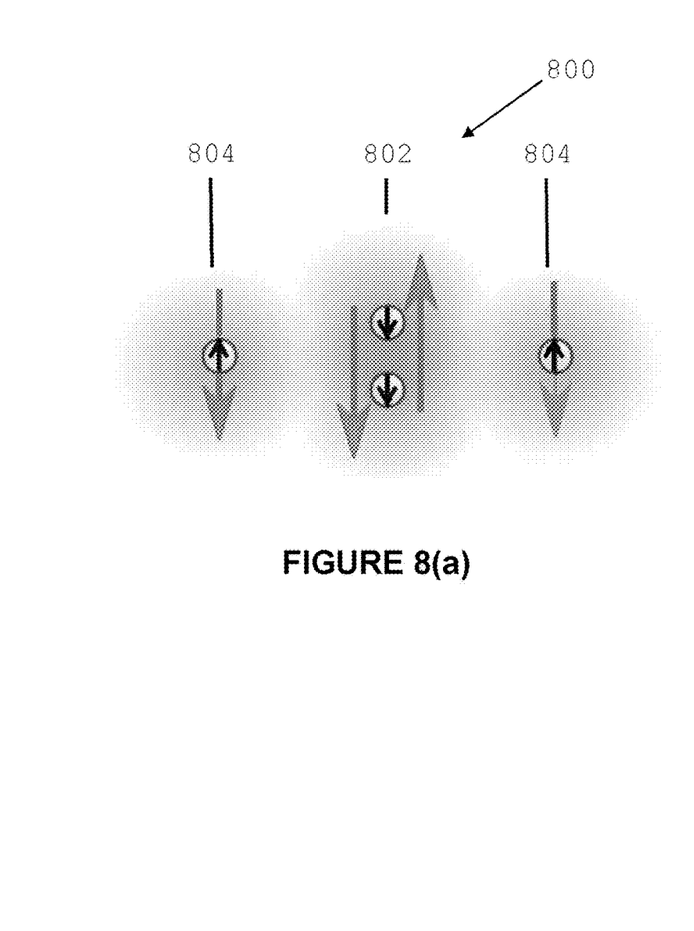
Figure 8B:
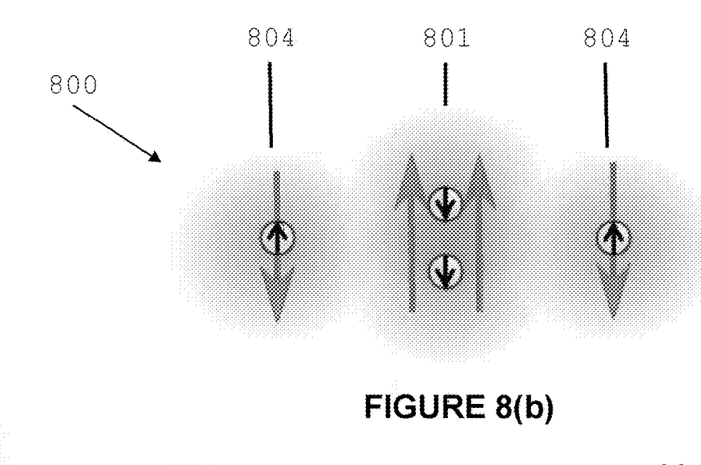
Figure 8C:
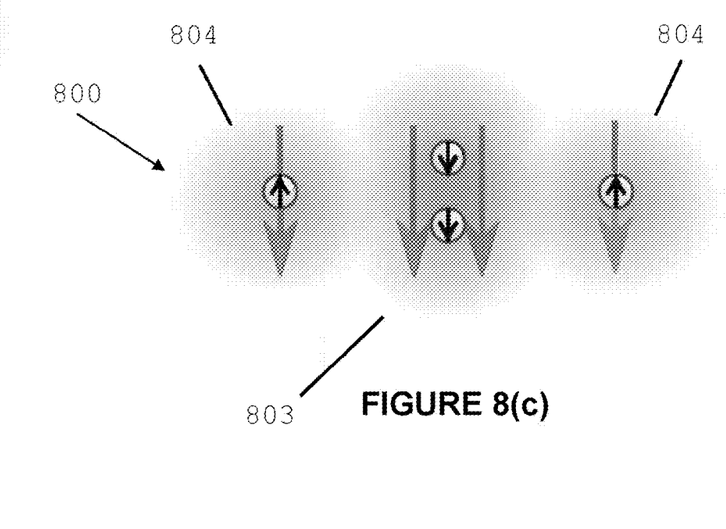

An alternative coupling method can be implemented by having two ancilla qubits between two data qubits, as illustrated in the system 800 of FIG. 8. FIG. 8(a), shows two ancilla qubits 802, positioned between data qubits 804. The ancilla qubits 802 are not ionised during the operation of the quantum protocol. The ancilla qubits 802 form a spin singlet which provides zero coupling between the data qubits 804. The ancilla qubits of system 800 can be initialised in a triplet state, as illustrated in FIGS. 8(b) and 8(c), to implement spin coupling. For example, the ancilla qubits 801 of FIG. 8(b) form a spin triplet which provides positive coupling between the data qubits 804, whilst the ancilla qubits 803 of FIG. 8(c) form a spin triplet which provides negative coupling between the data qubits 804. A similar alternative is that a multi-donor quantum dot is placed between the two donors, with the controlled number of electrons loaded onto that dot controlling the coupling.

In the embodiments where the information is encoded in the processing elements electronic spins, the placement of intermediate ancilla qubits with given spins may be used to mediate the coupling between data qubits.

Figure 9:
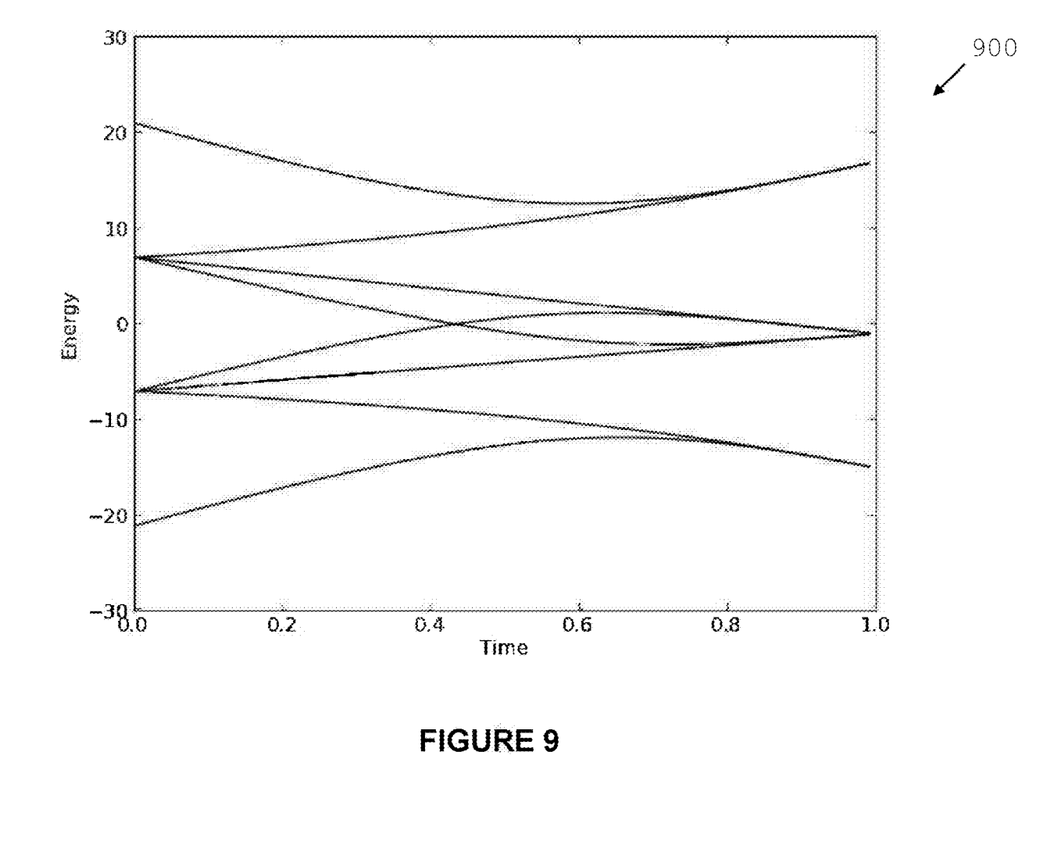
FIG. 9 is a diagram showing energy levels for a system of two donor qubits with a single intermediate qubit.

FIG. 9 shows an energy diagram 900 of the ferromagnetic couplings for two donor data qubits with a single intermediate ancilla qubit in between them as the magnetic field is decreased as time progresses. The lowest level at time zero is a superposition of the spin states of the two donor qubits, and at time 1.0 the two data qubits are in a ferromagnetic ground state. In some other embodiments, two ancilla qubits are placed between each couple of data qubits to provide an anti-ferromagnetic coupling. In some embodiments, the two ancilla qubits are placed at a distance of 0.4 d from the respective data qubit, where d is the distance between the data qubits. Hence, in these embodiments, the distance between the two ancilla qubits is 0.2 d. These relative distances can vary in different embodiments. Further to the sign and strength of the couplings between data qubits it is necessary to ensure that the coupling between two qubits is not affected by the couplings between other qubits in the matrix. In some embodiments, qubits couplings are isolated by acting on the nuclear spin and decreasing or eliminating the interaction strength between electrons which occupy sites with different nuclear spin orientations. The nuclear spins can be tuned by applying resonant electromagnetic pulses. The nuclear spin of the coupling qubit between two data qubits can be targeted regularly to affect the coupling strength.

Figure 10:
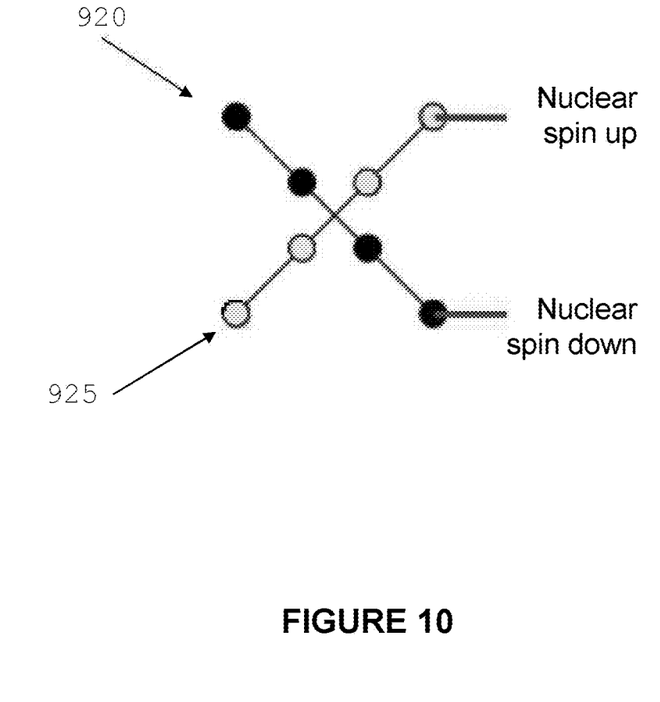
FIG. 10 is a schematic representation of two chains of coupled qubits.

Referring now to FIG. 10, there are shown two chains of qubits 920 and 925. Each qubit in each chain is coupled to the two neighbouring qubits. However, when two chains of qubit cross each other, as chains 920 and 925 in FIG. 10, the qubits disposed about the crossing may interact with each other creating interference. To correctly encode the problem Hamiltonian, the interference due to chain crossing should be decoupled from the qubits interaction.

This interference can be minimised by using the nuclear spins and refocussing the interaction between electrons of different nuclear spin polarisations. For example, chain 920 in FIG. 10 may be polarised with nuclear spin down and chain 925 with nuclear spin up. The interaction strength between electrons occupying sites with different nuclear spin orientations can be reduced by having electrons loaded onto two separate chains, each with a different nuclear spin orientation. In this case the interaction between qubits on the same chain would be promoted whilst the interaction with qubits on the crossing chain would be reduced. This may be accomplished by using a pulse sequence which alternately applies pulses to one chain and then the other chain. These pulses have the effect of refocussing inter-chain interactions, but not intra-chain interactions. These pulses must be repeatedly applied during the operation of the quantum computer. These pulses also aid refocusing of any spatially inhomogeneities in the applied direction.

Errors may be introduced in the quantum computation also by electrons tunnelling between different sites. In order to prevent this, ancilla and data donors may be placed at different potentials. This may be implemented by appropriately biasing the control members placing the data qubits at a different potential to ancilla qubits and suppressing tunnelling between sites, or by using multiple donors at each site with a single electron.

Other types of qubit interactions may be used in alternative embodiments.

For example, in some embodiments, qubits which are located in different sites of the qubits matrix can be coupled using optical or electrical coupling means realised on the Si substrate 105. The optical or electrical coupling means may operate in conjunction with the conductive gates used to address the qubits. In these embodiments the control gates may be functionally connected to the optical or electrical means and control the coupling between qubits when addressed with appropriate electronic signals.

Figure 11:
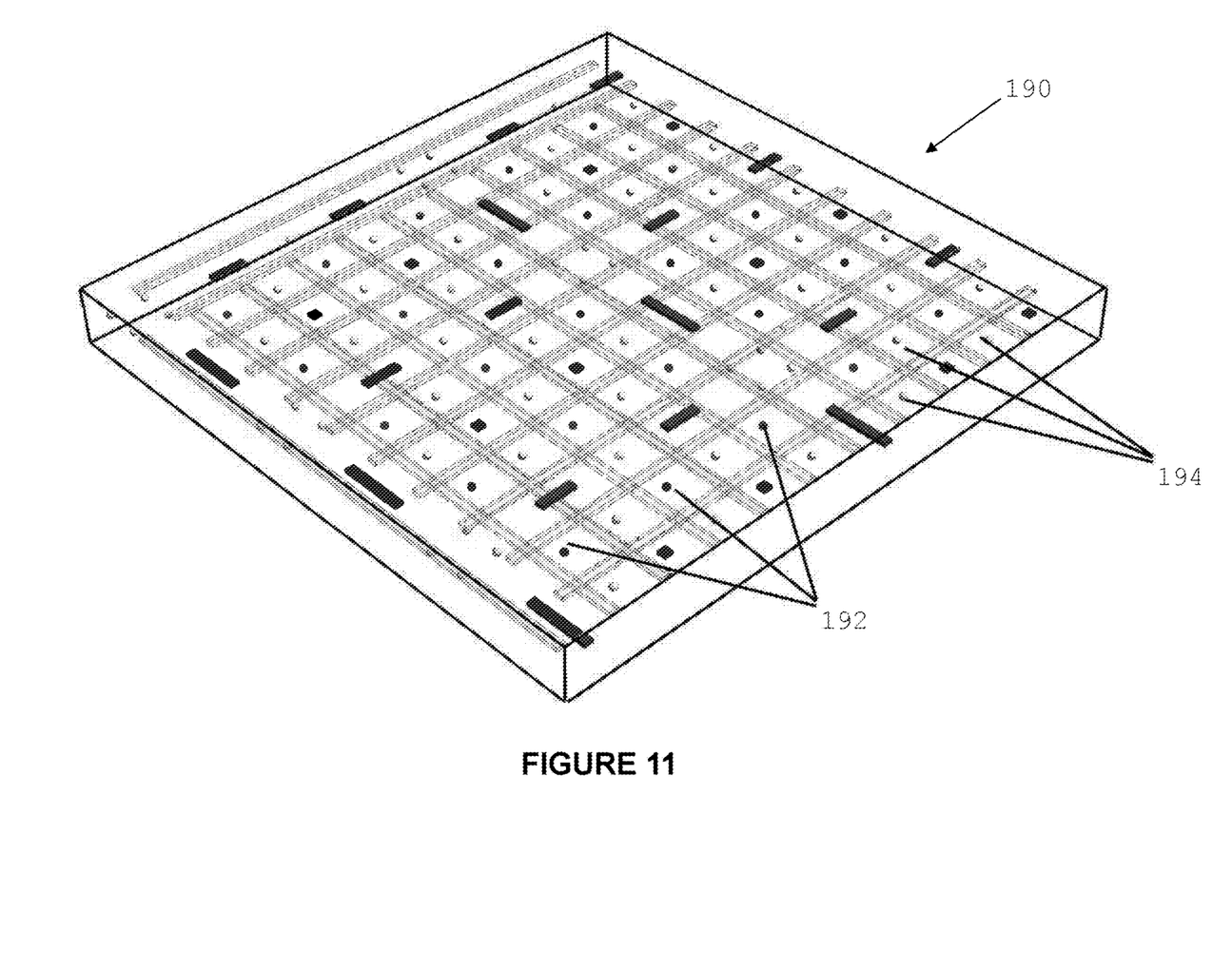
FIG. 11 is a schematic illustration of an alternative structure for an advanced processing apparatus in accordance with embodiments.

Referring now to FIG. 11, there is shown an alternative architecture for the quantum processor. This architecture is an alternative to the architecture of FIG. 1. The middle layer consists of qubits—separated into data qubits 192 and ancilla qubits 194. Data qubits encode the state of the coupling computer, while ancilla qubits are used to provide couplings between data qubits (as required by the problem Hamiltonian). The middle layer also contains the island of vertical SETs placed between source and drain and used both to load electrons onto selected donors, and also to read out nuclear and electron spin states.

Embodiments of the advanced processing architectures described above may be realised using different semiconductor processing methods. In some embodiments the architecture 100 can be realised using scanning tunnelling microscope (STM) micro to atomic-fabrication techniques in conjunction with other fabrication methods common in the microelectronics industry. In these embodiments the architecture is realised on a high purity $^{28}$Si substrate with a very low defect concentration and a very high surface quality, likely a floating zone Si substrate. The lower source lines 120 and gate lines 125 are realised by introducing a high concentration of dopant atoms, such as P, by STM. By introducing a very high concentration of dopants in some regions of the Si surface, the Si material becomes degeneratively doped and becomes highly conductive. Once this step is performed the lower layer of the architecture 100 is completed and a first layer of crystalline Si is grown on top of the lower layer by an epitaxy technique, such as molecular beam epitaxy (MBE). The thickness of the epitaxial Si layer varies in embodiments of the architecture 100 and defines the spacing between the source and gate electrodes at the lower layer of the architecture and the P donor sites 110 and SET islands 135. The P donor sites 110 and SET islands 135 are realised on the surface of the first epitaxial layer. The P donor sites 110 are realised by encapsulating a single P atom or cluster of P atoms in the Si surface at each qubit site by STM. The SET islands 135 are realised by introducing a very high concentration of dopant atoms in areas of the surface of the first epitaxial layer in the proximity of the P donor sites 110. The relative position of each SET island 135 to the respective P donor site 110 affects the biasing configuration of the control lines required to load or readout electrons to and from the P donor site 110. Once P donor sites 110 and SET islands 135 are realised, a second epitaxial Si layer is grown leading to the upper surface of the architecture 100. On this surface the drain lines 115 and gate lines 130 may be realised by a STM lithographic doping procedure, or by conventional microelectronics fabrication techniques, such as metal evaporation and/or photolithography.

In operation of the above described Si:P embodiment, the operating temperature of the quantum processor may be below 300 milliKelvin (mK), and may be in the region of 50 mK. A cooling arrangement may be required to maintain the processing apparatus at this low temperature. A source of constant magnetic field and a source of alternating magnetic field may also be required. The device also requires means for biasing the control lines by application of voltage.

In the above description, adiabatic quantum operation of the advanced processing apparatus has been described. The processing apparatus is not limited to this operation. For example, it is possible that a universal quantum processor may be implemented using a similar architecture, and controlling the coupling between qubits so that they are coupled across the apparatus. Other advanced processing apparatus may be implemented utilising the architecture of control lines and processing elements. For example, an advanced processing apparatus not based on a Si:P system may be implemented.

In the above described embodiments there are two levels of control members. The described technology is not limited to this. In other embodiments, there may be more levels of control members, and a corresponding plurality of layers of processing elements forming a "3D" processing apparatus.

Although the term 'matrix' has been used to describe qubits arranged in rows and columns, the described technology is not limited to that. In some embodiments, the qubits of the quantum processor may be arranged in different patterns and not be aligned in conventional rows and columns.

The term "comprising" (and its grammatical variations) as used herein are used in the inclusive sense of "having" or "including" and not in the sense of "consisting only of".

The quantum processor described herein uses quantum mechanics to perform computation. The processor may be used for a range of applications and provide enhanced computation performance, these applications include: encryption and decryption of information, advanced chemistry simulation, optimization, machine learning, pattern recognition, anomaly detection, financial analysis and validation amongst others. Further, in certain implementations, the invention may be used in communicating and processing image or video information, audio or data communication, and other similar implementations in the communications technology.

It will be appreciated by persons skilled in the art that numerous variations and/or modifications may be made to the inventive technology as shown in the specific embodiments without departing from the spirit or scope of the invention as broadly described. The present embodiments are, therefore, to be considered in all respects as illustrative and not restrictive.

The claims are as follows:

1. A quantum processor comprising:
    a plurality of qubit elements arranged in a planar two-dimensional matrix; and
    a control structure comprising a first set of elongated control members arranged in a first plane above a plane comprising the qubit elements and a second set of elongated control members disposed in a second plane below the plane comprising the qubit elements, wherein each control member is arranged to control a plurality of qubits and wherein the control structure is controllable to perform quantum computation using the qubit elements.

2. The processor of claim 1, wherein the control structure is controllable to interact simultaneously with the plurality of qubit elements to perform adiabatic quantum computation.

3. The processor of claim 1, wherein a quantum state of the qubit elements is encoded in a nuclear or electron spin of one or more donor atoms disposed in a plane embedded in a semiconducting structure.

4. The processor of claim 3, wherein the control structure is controllable to simultaneously load or unload electrons to or from a plurality of donor atoms.

5. The processor of claim 3, wherein a first set of donor atoms is arranged to encode quantum information related to the quantum computation and a second set of donor atoms is arranged to facilitate electromagnetic coupling between one or more of the first set of donor atoms.

6. The processor of claim 5, wherein each donor atom of the first set is arranged to electromagnetically interact with one or more of the other donor atoms of the first set in the matrix via one or more donor atoms of the second set.

7. The processor of claim 6, wherein each donor atom of the first set is arranged to electromagnetically interact with at least another donor atom of the first set disposed in a nearest neighbouring position in the matrix of donor atoms of the first set, the interaction being facilitated by one donor atom of the second set.

8. The processor of claim 6, wherein one or more donor atoms of the first set are arranged to electromagnetically interact with other donor atoms of the first set disposed diagonally to the one or more donor atoms of the first set in the matrix of donor atoms of the first set, the interaction being facilitated by one or more donor atoms of the second set.

9. The processor of claim 6, wherein one or more donor atoms of the first set are arranged to electromagnetically interact with at least three other donor atoms of the first set, the interaction being facilitated by one or more donor atoms of the second set.

10. The processor of claim 1, wherein each control member is disposed between two rows or columns of donor atoms of the first set.

11. The processor of claim 10, wherein:
    the control members of the first set are parallel to each other and the control members of the second set are parallel to each other; and
    the control members of the first set are disposed transversally to the control members of the second set to form a plurality of intersections where control members of different sets overlap in the direction perpendicular to the plane comprising the donor atoms.

12. The processor of claim 11, wherein the control structure further comprises a plurality of control elements disposed on a plane between the first and the second planes between two rows or columns of donor atoms of the first set.

13. The processor of claim 12, wherein each control element operates with respective control members of the first set and the second set as a single electron transistor.

14. The processor of claim 13, wherein each control element is arranged to interact with a plurality of neighbouring donor atoms.

15. The processor of claim 14, wherein the interaction comprises control of the spin orientation of the electron or nucleus of one or more donor atoms.

* * * * *